United States Patent [19]
Tsurishima et al.

[11] Patent Number: 5,208,529
[45] Date of Patent: May 4, 1993

[54] ELECTRIC DEVICE CONTACT ASSEMBLY

[75] Inventors: Kazuyuki Tsurishima; Teruaki Sakurada, both of Saitama, Japan

[73] Assignees: Sym-Tek Systems, Inc., San Diego, Calif.; Advantest Corp., Tokyo, Japan

[21] Appl. No.: 725,334

[22] Filed: Jul. 3, 1991

[51] Int. Cl.$^5$ .............................. G01R 1/02; G01R 1/04
[52] U.S. Cl. ................................ 324/158 F; 324/72.5; 324/158 P; 439/70
[58] Field of Search ............... 324/158 F, 158 P, 72.5; 439/68, 70, 526, 525, 73, 333

[56] References Cited

U.S. PATENT DOCUMENTS

| | | |
|---|---|---|
| 4,000,798 | 1/1977 | Cedrone . |
| 4,124,132 | 11/1978 | Pennings . |
| 4,155,612 | 5/1979 | Silverio ................................. 439/70 |
| 4,234,418 | 11/1980 | Boissicat . |
| 4,370,011 | 1/1983 | Suzuki et al. . |
| 4,506,213 | 3/1985 | O'Connor ......................... 324/158 F |
| 4,686,468 | 8/1987 | Lee et al. ............................ 439/68 |
| 4,715,823 | 12/1987 | Ezura et al. ........................ 439/70 |
| 4,836,797 | 6/1989 | Riechelmann . |
| 4,926,118 | 5/1990 | O'Connor . |
| 4,933,808 | 6/1990 | Horton et al. ....................... 439/73 |
| 4,933,955 | 2/1991 | Savant ................................. 439/73 |
| 4,996,476 | 2/1991 | Balyasny et al. ................ 324/158 F |
| 5,027,063 | 6/1991 | Letourneau ..................... 324/158 F |

FOREIGN PATENT DOCUMENTS

| | | |
|---|---|---|
| 3311704 | 10/1984 | Fed. Rep. of Germany ... 324/158 F |
| 0018338 | 1/1982 | Japan .............................. 324/158 F |
| 0122644 | 5/1990 | Japan .............................. 324/158 F |

OTHER PUBLICATIONS

"Component Positioning Device", by Houser, IBM Tech. Discl. Bull., vol. 15, #9, Feb. 1973, pp. 2971-2972.

"Module Test and Handling Apparatus" by House, IBM Tech. Disc. Bull. vol. 16, #11, Apr. 1974, pp. 3653-3654.

"Rotational Locator", by Busacco, IBM Tech. Disc. Bull., vol. 14, #3, Aug. 1971, p. 763.

Primary Examiner—Ernest F. Karlsen
Assistant Examiner—William J. Burns
Attorney, Agent, or Firm—Knobbe, Martens, Olson & Bear

[57] ABSTRACT

A contact assembly for use in testing electric devices such as integrated circuits (IC's) and the like is comprised of a test socket and a corresponding carrier module for positioning the electric devices to be tested in alignment with the test socket. The carrier module is provided with a holding mechanism for retaining electronic devices to be tested in their proper position in the seat of the module, the holding mechanism being retractable so as to not interfere with the electrical contact between the socket and the electric device. In another aspect of the present invention, the contact assembly is provided with a slide positioning mechanism for slidably positioning the electronic device in its proper location on the seat of the carrier module.

16 Claims, 4 Drawing Sheets

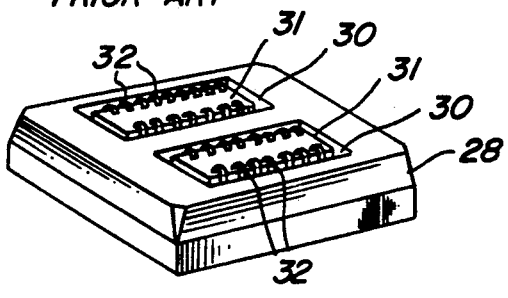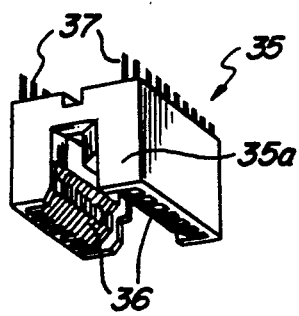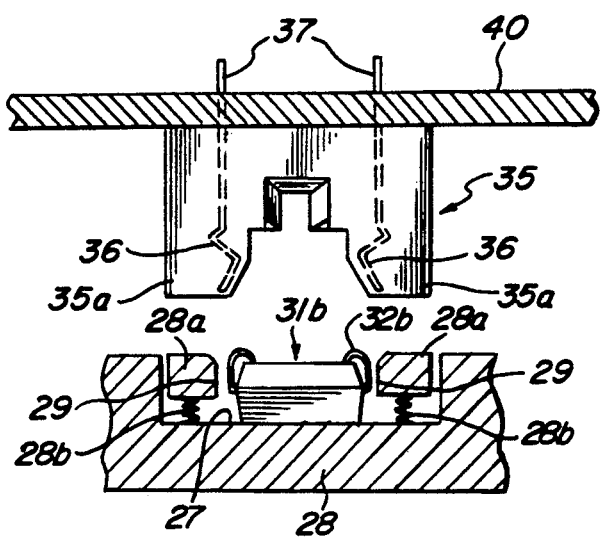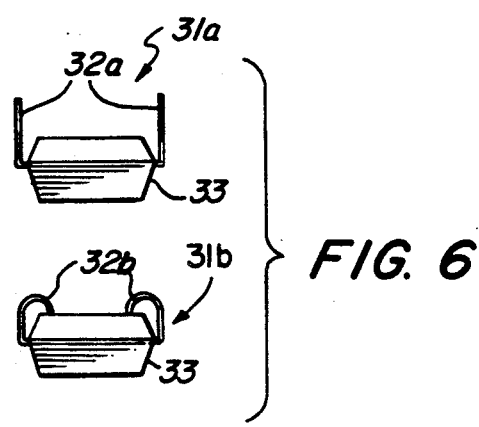

ELECTRIC DEVICE CONTACT ASSEMBLY

FIELD OF THE INVENTION

This invention relates to a contact assembly for testing electric devices such as integrated circuits ("IC's"), semiconductor chips, and the like, and more particularly, to an electric device contact assembly for improving the productivity and reliability of a test head contact mechanism used in an electric device test system having a test tray for mounting the electric devices to be tested.

BACKGROUND OF THE INVENTION

In the electronics industry, there is a constant demand for electric devices, such as integrated circuits ("IC's") or semiconductor chips, to be produced less expensively and in smaller dimensions. One way to increase productivity of such electric devices, and thereby reduce their unit cost, is to increase the test speed of the devices by testing a plurality of them at the same time.

It has become a test technology standard to place a number of electric devices to be tested on a test tray and position them so as to be engaged by a test head plate having a number of corresponding test contactors. One device is placed on a seat of a carrier module, and each carrier is typically provided with a pair of device seats. A number of modules are then positioned on a tray so as to be in vertical alignment (either above or below) with a test head plate. Each module is aligned with a corresponding test contactor so that when either the test tray or the test head plate are moved in a vertical direction relative to one another, the contactor engages the device positioned within the carrier.

The contactor is provided with a number of test pins or electric leads which come into electrical communication with the leads of the electric devices to be tested. The test system is provided with a test signal generator for supplying a test signal to the device, and with a signal comparator for analyzing the results of the test. Based on such results, the electric devices are transferred to another location in the test process and sorted for proper handling.

Thus, in order to increase the volume of electric devices that can be tested in the manner described above during a given period of time, it is desirable to maximize the efficiency of the contact test assembly, including primarily the test contactor and the carrier containing the electric devices. However, such standard electric device test systems described above suffer from a number of disadvantages. First, the contactors for engaging the electric leads of the devices are specially made for engagement with a device of a particular configuration. Furthermore, the structure of such contactors in a conventional test system is complicated since they utilize, other than contact pins, a mechanical drive mechanism which selectively engages and disengages each lead of the device to be tested in accordance with an external power source such as compressed air. One example of such complicated, specially made contactors is disclosed in U.S. Pat. No. 4,370,011.

Secondly, such specially made contactors are typically not available as "off-the-shelf" items and are therefore relatively expensive. Third, because of the relatively complicated nature of the mechanical structure of the contactors, they are typically large in size. Therefore, it is difficult to assemble a number of such contactors in a confined area in order to increase the density of test contacts. Therefore, the number of electric devices that can be tested at one time is limited. Fourth, such conventional contactors are not highly reliable because of the complexity of their mechanisms, especially when attempts are made to assemble a large number of such contactors on a test head plate.

Additionally, the size and configuration of standard electric chips is rapidly changing. For example, some of the high speed ICs have very short signal leads, instead of the relatively longer leads used in the conventional dual in line ("DIP") type package. In order to test such short leads, conventional contactors cannot be used since secure engagement with the electric devices to be tested is prevented by the interior walls of the carrier modules. Furthermore, in conventional test systems using trays, carrier modules placed on a tray are used only for a certain predetermined type and shape of electric device. If the outer shape of the electric device to be tested changes, the carrier modules must also be changed. Thus, it is very expensive to have a large number of carrier modules of various configurations. Moreover, it is time consuming to change the carriers every time a different chip is to be tested.

Thus, there is a serious need in the electric device test industry for a contact assembly which can overcome the problems described above.

SUMMARY OF THE INVENTION

The present invention comprises an improved contact assembly which is compatible with a wide variety of electric device configurations and which can therefore be used to test substantially increased volumes of such devices during a given time.

The contact assembly comprises an improved test contactor having a socket arrangement and an IC carrier module which can securely retain chips of various configurations. The test contactor of the present invention can efficiently make electric contact with either the leads of conventional DIP packages or with the shorter leads of modern IC's by utilizing a socket arrangement. This arrangement is not mechanically complicated and allows for substantially increased test density.

The chip carrier of the present invention flexibly allows for interference with the contactor and at the same time adequately holds the chip in place. The carrier is provided with a flexible holding mechanism which retains the chip in position prior to testing, but is then releasably moved from an interfering position by the contactor as it engages the electric device. Preferably the holding means is spring loaded so that it is compressed in a vertical plane as test engagement is carried out by the contactor. Following the test, the spring loaded holding mechanism returns to its original position to securely retain the chip in place.

The contactor assembly is also provided with a slide positioning mechanism which accurately positions the electric device on its seat within the carrier module prior to testing. Preferably, the slide positioning mechanism comprises at least one tapered planar surface which engages the electric device as relative vertical movement between the chip and contactor occurs. The combination of the tapered surface and the vertical movement urges the chip properly into location on the carrier seat. The slide positioning mechanism can comprise, if desired, tapered edges which urge the electric device, as needed, either to the front or to the rear in the longitudinal direction, as well as to the left or the right in the transverse direction.

Thus, the contact assembly of the present invention provides a universal socket contactor and carrier that can quickly and efficiently test a wide variety of electric devices.

BRIEF DESCRIPTION OF THE DRAWINGS

FIG. 3 is a perspective view of a conventional carrier module, a number of which are placed in rows in the test tray of FIG. 2, wherein the carrier is provided with a pair of seats for electric devices.

FIG. 4 is a perspective view of one example of a test contactor or socket of the present invention.

FIG. 5 is a partial sectional view explaining the inter-engagement of the socket and carrier module of the present invention.

FIG. 6 is a schematic illustration of the typical shapes of electric devices to be tested in the test system of the present invention, wherein the upper device has conventional leads and the lower device has more modern short leads.

DETAILED DESCRIPTION OF THE INVENTION

Figure 1:
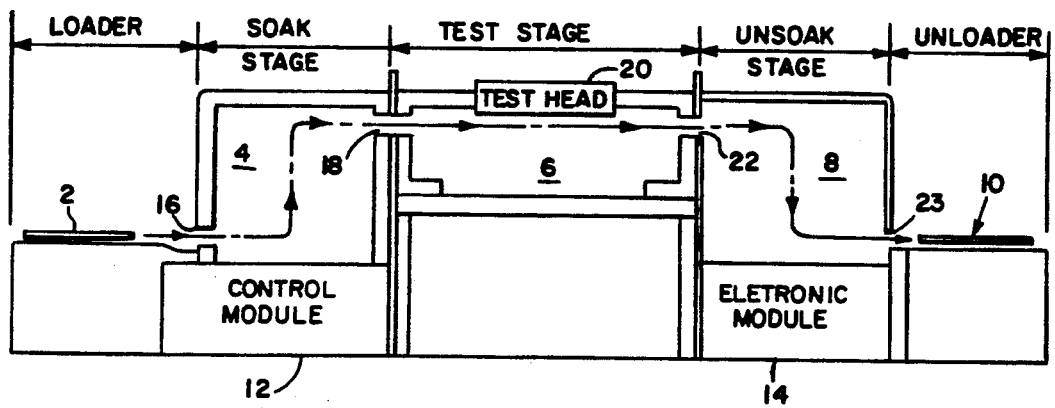
FIG. 1 is a schematic illustration of the basic structure and flow paths of a typical electric device test system which utilizes test trays for carrying a large number of electric devices to be simultaneously tested.
Figure 2:
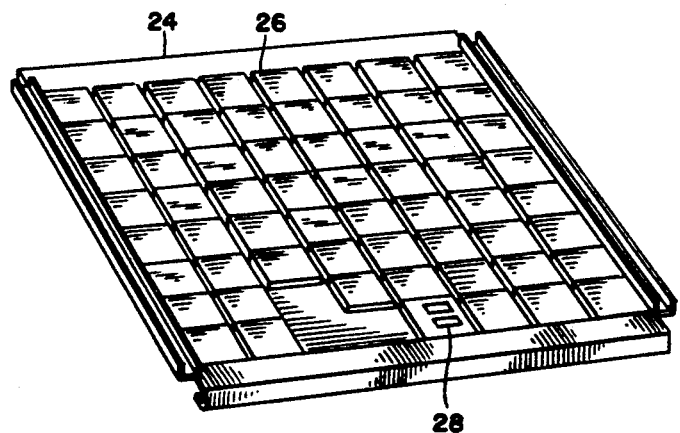
FIG. 2 is a perspective view of a typical tray used in the test system of FIGURE illustrating a number of carrier modules having two seats each for receiving electric devices to be tested.

FIG. 1 illustrates generally a electric device test system utilizing a contact assembly and test trays. A typical test tray is shown in FIG. 2 and will be described in more detail below. Essentially, a number of test trays containing electric devices are processed through the test system of FIG. 1 in a stage-by-stage manner in order to test the electric devices for defects. The focus of the present invention is in the test head stage where the contact assembly is located.

The electric device test system of FIGURE is comprised of a loader 2, a "soak" stage 4, a test head 6, an "unsoak" or exit stage 8, an unloader 10, a control module 12, and an electronic module 14. The loader 2, at the direction of the control module 12, loads pluralities of electrical devices in test tray through a first gate 16 into the soak stage 4. The trays are timely and orderly conveyed through the soak stage in which the ambient temperature is selectively elevated above or lowered below the temperature external to the test system to such a degree that, at the conclusion of the passage of the trays through this stage, said devices are at a desired testing temperature.

At the conclusion of the soak stage, each tray of electrical devices is transferred through a passageway 18 into the test stage 6, the environment of the test stage being suitable to maintain the devices at their desired testing temperature. While in the test stage, the electrical leads of all the devices are electrically contacted by a test head 20. The leads of the full set of devices can be contacted simultaneously, or the leads of suitable subsets of the devices can be contacted simultaneously in steps, depending on the capacity of the test head. Via the test head, the devices are energized, stimulated, and their responses monitored for test purposes by a tester (not shown) which communicates with the devices through the test head.

At the conclusion of the test, each set of electrical devices is transferred from the test stage to the unsoak stage 8 through a second gate 22. Each of said sets is gradually conveyed through the unsoak stage. During this time, they are exposed to an environment in which heat is transferred from or to the devices to the extent that, at the conclusion of this stage, the temperature of said devices is at or near equilibrium with the environment external to the test system. The trays are then removed from the unsoak stage through passageway 23 by the unloader 10.

Referring to FIGS. 2 and 3, the sets of electronic devices are transported throughout the test system in a generally planar transport medium, or a test tray 24, on which the devices are coordinated and arranged co-planarly such that the electrical leads of all devices are accessible from at least one common planar side of the tray. The test tray comprises a plurality of carrier modules 28 aligned in rows and columns as illustrated. The outer shape of each carrier module 28 is precisely identical with the others so that the position of the test head 20 with respect to the test tray 24 can be precisely defined. Instead of having modules with a precise outer shape, however, it is also possible to utilize other positioning means, for example, a framework arranged in rows and columns including contact means to attach carrier modules. In the example of FIG. 3, the carrier module 28 has two electric device seats 30 wherein the electrical devices 31 to be tested will be placed with electrical leads 32 pointed upward. The electric devices 31 shown in FIG. 3 is a typical type of integrate circuit (IC).

FIG. 4 shows a perspective view of an example of a test contactor or socket 35 for testing ICs in accordance with the present invention. The test socket 35 comprises a molded housing 35a, contact leads 36 which mate with the leads of the IC, and electrical pins 37 which provide and receive electric signals to and from ICs to be tested for communicating with the tester (not shown). Although not used for testing purposes of the type described herein, this kind of socket is commonly used and readily available in the electronics field for other applications. One such socket is available from Yamaichi Electronics, Inc. An important advantage of the present invention is to utilize a standard IC socket as a contactor in the test head 20, shown in FIG. 1, so that a large number of such contactors can be used, thereby contributing to cost reduction, space reduction and increased reliability. In other words, a socket-type contactor alleviates the need for complex mechanical mechanisms which take up additional space on the test head plate and decrease the numbers of IC's that can be simultaneously tested.

FIG. 5 shows the structure of a contact assembly using the test socket 35 in FIG. 4 and the conventional carrier module 28 of FIG. 3. In FIG. 5, only one unit of contactor assembly is shown for simplicity of explanation, however, in the actual system, a large number of the same units are aligned in the test system. The test socket 35 is mounted, for example, on a printed circuit board 40. The electric pins 37 of the test socket 35 project on the upper side of the printed circuit board 40 for stimulating the IC to be tested by the test signal from the tester (not shown) and for providing the resultant signal from the IC under test to the tester.

In the seat 27 of the carrier module 28, an electric device, for example, an IC to be tested, is set with its electric leads oriented upwardly to contact with the contactor leads 36 in the test socket 35. The size of the seat 27 is arranged so that the inner walls 29 of the seat closely contain them so as to fix the IC device in a predetermined position. Therefore, in conventional carrier modules, the size of the seats will vary depending on the outer shape and size of the electric devices to be tested.

In the contactor assembly of FIG. 5, the outer shape of the IC devices to be tested is limited to ICs of, for example, the conventional dual-in-line type package IC 31a as illustrated in FIG. 6. The IC 31a has long and straight leads or pins 32a projecting from the package 33. When the socket 35 and the carrier modules 28 contact each other, the IC leads 32a can connect with the contact leads 36 of the test socket 35.

However, recent demands for high speed and high reliability of electronic devices requires IC leads to be shorter. One of the examples of this kind of package is called a small outline J-lead package (SOJ) and is shown as IC 31b in FIGS. 5 and 6. The SOJ type IC 31b has electrical leads 32b which are short and J-shaped and the end of the leads 32b are attached to the surface of the package. When testing the SOJ type IC 31b in the contact assembly of FIG. 5, the top part of mold housing 35a of the socket 35 and the side part 28a of the slot 27 of the carrier module 28 come in contact with each other. Advantageously, the side parts 28a of the seat 27 are independently movable in a generally vertical direction by means of a spring loading, as indicated at 28b in FIG. 5. Thus, the leads 32b can fully contact with the test leads 36. After the test is completed, the side parts 28a are biased upwardly by the spring loading 28b so that the inner walls 29 of the seat 27 may again closely contain the IC 31b in the seat.

Figure 7:
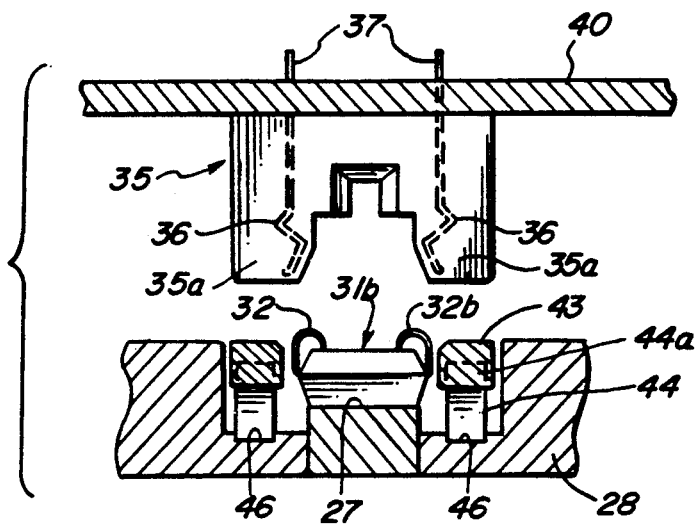
FIG. 7 is a partial sectional view of a contact assembly constructed in accordance with a preferred embodiment of the present invention.

FIG. 7 is a cross sectional view of one of the preferred embodiments of the present invention. Again, in FIG. 7, only one unit of contactor assembly is shown for simplicity of explanation, however, in the actual system, a number of the same units are aligned in the test system. The test head structure is identical to that of FIG. 5, wherein the IC socket 35 is mounted, for example, on a printed circuit board 40. The electric pins 37 of the IC socket 35 project on the upper side of the print circuit board 40 for stimulating the IC to be tested by the test signal from the tester (not shown) and for providing the resultant signal from the IC under test to the tester.

In FIG. 7, the carrier module 28 has a wider seat 27 so that the lower portion 35a of the IC socket 35 can go into the seat upon contact. The carrier module 28 includes, in both sides of the seat, a pair of hold bars 43 and flat springs 44. The hold bars 43 and flat springs 44 comprise a retaining and holding mechanism for keeping the IC 31 in its proper location on the seat 27 before and after the test function. The flat spring 44 can be replaced by any devices which have a similar functions, for example, by a coil spring, or rubber or elastic silicon materials. The size of the hold bar 43 is determined by the size of the electric device to be tested so that the position of the electric device is contained by the hold bar 43 when the contact assembly is in a non-contact state, as shown in FIG. 7. When in contact state, the lower portion 35a of the IC socket 35 pushes down the hold bars 43 and the flat springs 44 so that the IC socket 35 extends into the seat 27 of the carrier module 28. As a result, the J-shaped leads 32 and the test leads 36 can sufficiently contact each other.

Figure 8:
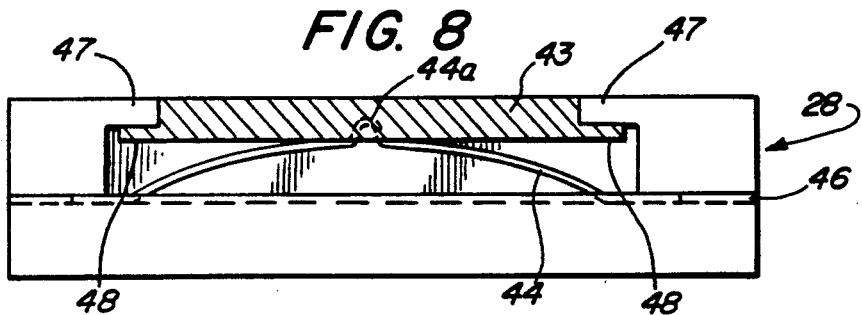
FIG. 8 is a sectional view of a holding mechanism mounted on the carrier of the present invention.

FIG. 8 is a cross sectional side view of the carrier module 28 of FIG. 7. In this example, the hold bar 43 has a hole at its center wherein a projection 44a of the flat spring 44 is fixed. Both ends of the flat spring 44 are inserted in a slit 46 in the carrier module 28, so that when the hold bar 43 is depressed, both ends of the flat spring 44 can slide along the slit 46. When at rest, end portion 48 of the hold bar 43 contacts stopper 47 of the carrier module 28 by the blasing force of the flat spring 44. With the configuration illustrated in FIGS. 7 and 8, electronic devices having very short signal leads, such as the SOJ package IC, can be accurately positioned on the seat 27 and retained by the hold bars 43. The test socket 35 can enter into the seat of the carrier 28 so that the leads of the device and the test leads 36 of the socket 35 can make sufficient contact with each other.

Figure 9:
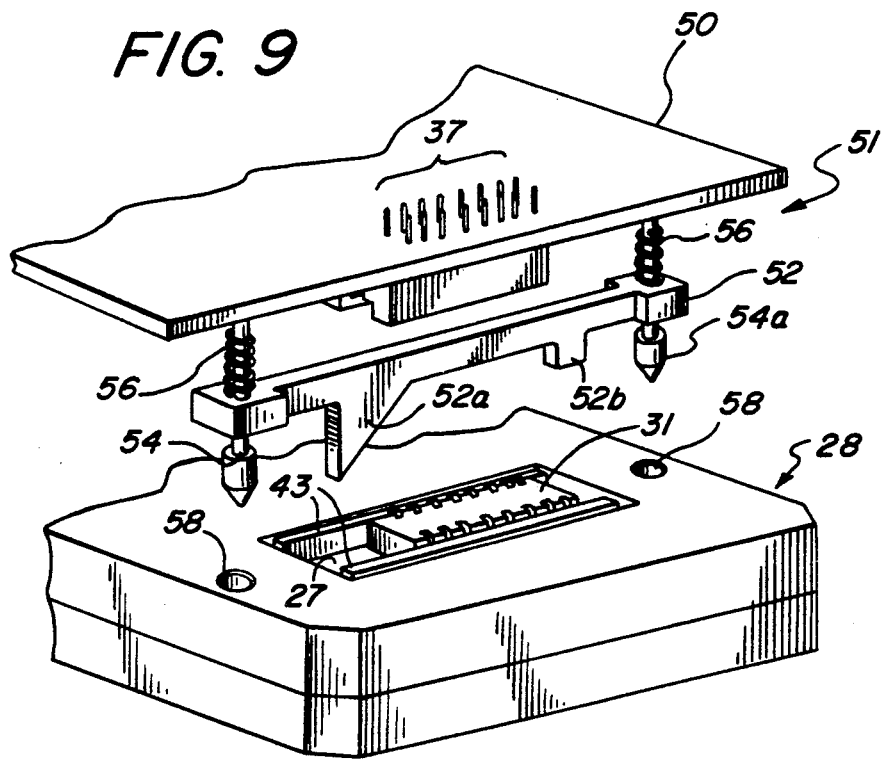
FIG. 9 is a perspective view illustrating the attachment of a slide positioning mechanism to the contact assembly of the present invention.

FIG. 9 shows a perspective view of a preferred embodiment of another aspect of the present invention. In accordance with this aspect of the present invention, a slide positioning mechanism 51 positions electric devices to be tested which have differing lengths. In an effort to standardize dimensions of electronic devices, such as IC's, the electronics industry has provided for a standard width, height, distance between leads, etc. for particular type of IC packages. For example, as with a dual-in-line (DIP) package of the type illustrated in the upper portion of FIG. 6, IC's of this variety have many different functions and capacity, but differ in only one dimension, namely the length of the chip. The length will differ depending upon the "pin count" or number of electrical contacts or leads extending out from the chip package. This standardization is also true for other types of IC's, such as the small outline J-lead package (SOJ) as illustrated in FIGS. 7-9.

With conventional carrier modules for testing IC devices, even these differences in lengths required that a different module be utilized for each particular device. Thus, it is very inconvenient and time-consuming to change a large number of carrier modules on a test tray simply because the length of the IC's to be tested has changed.

In the embodiment of FIG. 9, a slide positioning mechanism 51 is provided for each contactor assembly to adjust and define the correct position of electric devices 31 of differing lengths. Again, in FIG. 9, only one unit of contactor assembly is shown for simplicity of explanation, however, in the actual system, a number of the same units are aligned in the test system. The structure of the test head is similar to that of FIGS. 5 and 7, wherein the IC socket 35 is mounted on a printed circuit board 50. The IC socket 35 preferably has the largest number of test leads 36 (FIG. 7) and the electric pins 37 so as to correspond to the longest possible ICs to be tested.

Figure 10:
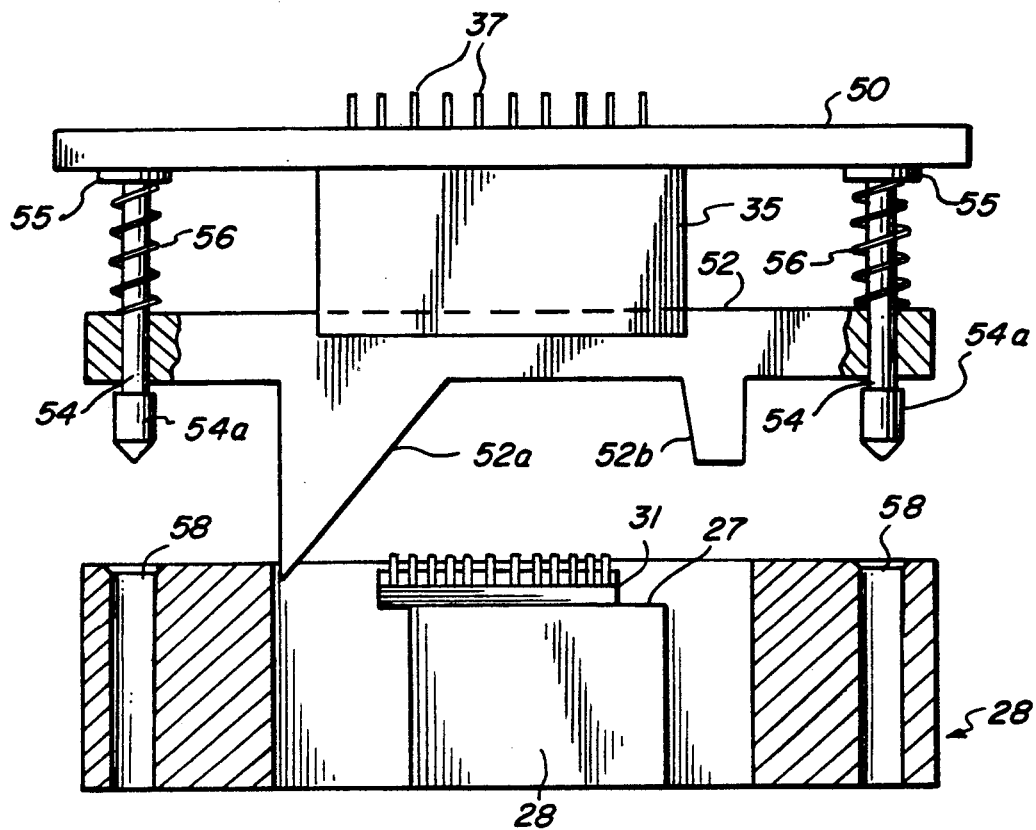
FIG. 10 is a partial sectional view explaining the function of the positioning mechanism of FIG. 9 wherein the contact assembly is disengaged.

In the contact assembly of FIG. 9, a slide bar 52 having a tapered end 52a and a stopper end 52b is vertically slidably connected to support cylinders 54. Each support cylinder 54 is connected to the printed circuit board 50 by, for example, screws at end portions 55 (FIG. 10). Each support cylinder 54 has, at its distal end, a head 54a of larger diameter than the sliding portion. The heads 54a have a tapered top to smoothly contact with the carrier module at guide holes 58. The contact assembly of FIG. 9 also includes coil springs 56 between the printed circuit board 50 and the slide bar 52. The carrier module 28 has a seat 27 wherein an electric device to be tested is placed. Preferably, the seat has a length long enough to accommodate the longest device, for example, the largest pin count ICs to be tested. Also, preferably, both sides of the seat 27 are provided with the hold means including hold bars 43, as discussed above and described in FIG. 7.

Figure 11:
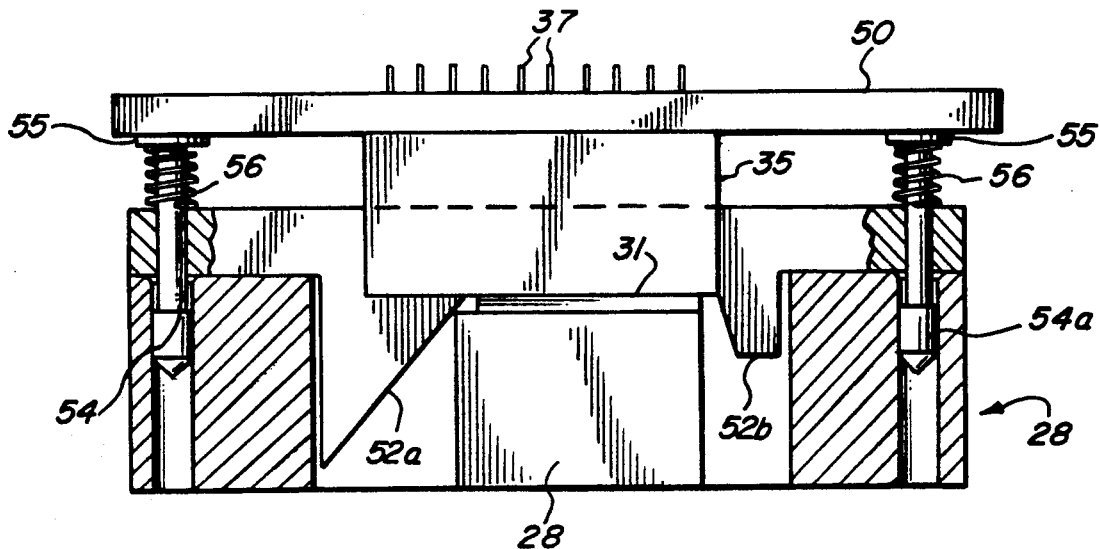
FIG. 11 is a partial sectional view explaining the function of the positioning mechanism of FIG. 9 wherein the contact assembly is engaged.

FIGS. 10 and 11 show cross sectional side views which explain the movement of the contact assembly in accordance with the present invention. When the contact assembly is not in contact, the coil springs 56 bias the slide bar 52 downward until stopped at the head 54a of the support cylinders 54. The electronic device 31 to be tested is at rest in its free position with respect to longitudinal direction in the seat 27 of the carrier module 28. The guide holes 58 have a slightly larger diameter than that of the head 54a of the support cylinder 54.

As the test socket 35 and the carrier module 28 approach one another, the tapered edge 52a on the slide bar 52 touches with a left end portion of the IC 31. As the test socket 35 advances further toward the carrier module 28, the IC 31 is moved to the right side until it is stopped by stopper 52b. The position of the stopper 52b is arranged so that the right end leads of the electric device align accurately with the right end of test leads 36 of the test socket 35. In this manner, the electric device 31 is connected with test socket 35 in its correct, predetermined position.

After testing the electric device 31, the test socket 35 and carrier module 28 separate from each other by moving in the opposite direction. By the force of the coil spring 56, the electric device 31 is separated from the test socket 35 and remains in the seat 27 of the carrier module 28. In other words, as the socket 35 is lifted upward in disengaging movement from the IC 31, the force of the coil spring 56 is no longer overcome by the engagement of the socket 35 and IC 31, as illustrated in FIG. 11. Therefore, the force of the coil spring 56 is allowed to act in a downward direction on the slide bar 52 which in turn acts in a downward direction on the IC 31. This opposite movement of the socket 35 in an upward direction and the slide bar acting in a downward direction on the IC 31, facilitates separation of the two elements.

It will be noted that there is a slight taper on the stopper 52b which is useful in the event that the IC 31 is offset from the seat slightly to the right hand direction (with reference to FIG. 10). Furthermore, various tapers and other configurations for the slide bar 52 are possible which would achieve the same objectives as those illustrated in FIG. 10. Moreover, if necessary, a similar slide bar arrangement could be mounted on the socket 35 in a transverse direction in order to locate the IC on the seat 27 in that direction.

Although the invention has been described in terms of the preferred embodiment, other embodiments that are apparent to those of ordinary skill in the art are also within the scope of the invention. Accordingly, the scope of the invention is intended to be defined only by reference to the appended claims.

What is claimed is:

1. A contact assembly for use in connection with an electronic device test system having a test signal generator and a signal comparator, comprising:

a test socket having a plurality of test leads and a plurality of electric pins corresponding to said test leads, said test leads contacting the signal leads of an electric device under test, and said electric pins providing to said electric device under test stimulus test signals from said test signal generator and further providing the resultant signals from said electric device under test to said signal comparator;

a carrier module for carrying electric devices to be tested to a corresponding test position in said electric device test system, said carrier module having seats for setting said electric devices to be tested therein; and a hold means for holding said electric devices to be tested in said seats of said carrier module while at rest and releasing said hold from said electric device when contact is made between said test socket and said electric device under test.

2. A contact assembly for use in connection with an electronic device test system having a test signal generator and a signal comparator, comprising:

a test head for testing a plurality of electric devices in parallel at the same time;

a test socket mounted on said test head and having a plurality of test leads and a plurality of electric pins corresponding to said test leads, said test leads contact with signal leads of an electric device under test, and said electric pins provide said electric device under test stimulus test signals from said test signal generator and provide the resulted signals from said electric device under test to said signal comparator;

a carrier module for carrying electric devices to be tested to a corresponding test position in said electric device test system, said carrier module having seats for setting said electric devices to be tested therein;

a test tray for carrying and aligning a plurality of said carrier modules;

a hold means for holding said electric devices to be tested in said seat of said carrier module while at rest and releasing said hold from said electric devices when there is contact between said test socket and said electric device under test, said hold means being provided in said carrier module.

3. A contact assembly as defined in claims 1 or 2, wherein said hold means comprises a pair of hold bars and a pair of springs to sustain said hold bars at the upper part of said carrier module, said hold bars and said spring are provided at both sides of said seats in said carrier module.

4. A contact assembly as defined in claim 3, wherein said spring is a flat spring.

5. A contact assembly as defined in claim 3, wherein said spring is a coil spring.

6. A contact assembly as defined in claim 3, wherein said spring comprises of elastic material.

7. A contact assembly for use in connection with an electronic device test system having a test signal generator and a signal comparator, comprising:
- a test head for testing a plurality of electric devices in parallel at the same time;
- a test socket mounted on said test head and having a plurality of test leads and a plurality of electric pins corresponding to said test leads, said test leads contact with signal leads of an electric device under test, and said electric pins provide said electric device under test stimulus test signals from said test signal generator and provide the resulted signals from said electric device under test to said signal comparator;
- a carrier module for carrying electric devices to be tested to a corresponding test position in said electric device test system, said carrier module having seats for setting said electric devices to be tested therein;
- a test tray for carrying and aligning a plurality of said carrier modules;
- a slide positioning means for slidably positioning said electric devices to be tested whose length is shorter than the length of said seats in said carrier module to a predetermined position corresponding to said test leads of said test socket;
- a hold means for holding said electric devices to be tested in said seats of said carrier module while at rest and releasing said hold from said electric devices when contact between said test socket and said electric device under test, said hold means being provided in said carrier module.

8. A contact assembly for use in connection with an electronic device test system having a test signal generator and a signal comparator, comprising:
- a test head for testing a plurality of electric devices in parallel at the same time;
- a test socket mounted on said test head and having a plurality of test leads and a plurality of electric pins corresponding to said test leads said test leads contacting with signal leads of an electric device under test, and said electric pins providing said electric device under test stimulus test signals from said test signal generator and providing the resulted signals from said electric device under test to said signal comparator;
- a carrier module for carrying electric devices to be tested to a corresponding test position in said electric device test system, said carrier module having seats for setting said electric devices to be tested therein;
- a test tray for carrying and aligning a plurality of said carrier modules;
- a slide positioning means connected to said test head at said test socket for automatically slidably positioning said electric devices to be tested whose length is shorter than the length of said seat in said carrier module to a predetermined position corresponding to said test leads of said test socket when said test socket and said carrier module are caused to engage each other, said slide positioning means comprising a slide bar for sliding said electric devices to be tested in a longitudinal direction, a pair of support cylinder for supporting said slide bar to said test head and a pair of springs for separating said electric device from said test socket after testing.

9. A contact assembly as defined in claim 7, wherein said test socket includes the maximum number of test leads and electric pins corresponding to said longest electric devices to be tested.

10. A contact assembly as defined in claim 7, wherein said seat on said carrier module has the maximum length sufficient to set therein the longest electric devices to be tested.

11. A contact assembly as defined in claim 8, wherein said slide bar includes a taper which corresponds to the maximum length of said electric device and a minimum length of electric device to be tested, and a stopper which stops longitudinal movement of said electric device so that one of said electric device to be tested meets with the predetermined end of said test socket.

12. A contact assembly as defined in claims 8, wherein said carrier module includes a pair of guide holes so that heads of said pair of support cylinders can go in, said heads of said pair of support cylinder and inlets of said guide holes are tapered to secure smooth positioning and insertion between said heads and said guide holes.

13. A method of electrically contacting electric device leads in a contact assembly for testing said electronic device by a test system having a test signal generator and a signal comparator, comprising:
- providing a test socket having a plurality of test leads and a plurality of electric pins, said test leads contact with signal leads of an electric device under test, and said electric pins provide said electric device under test with stimulus test signals from said test signal generator and provide the resulted signals from said electric device under test to said signal comparator;
- positioning a carrier module for carrying electric devices to be tested to a corresponding test position in said electric device test system, said carrier module having seats for setting said electric devices to be tested therein;
- holding said electric devices to be tested in said seats of said carrier module while at rest and releasing said hold from said electric devices when contact between said test socket and said electric device under test, said hold means being provided in said carrier module.

14. A method of electrically contacting leads of an electric device in a contact assembly for testing said electronic device by a test system having a test signal generator and a signal comparator, comprising:
- providing a test head for testing a plurality of electric devices in parallel at the same time;
- mounting a test socket on said test head and having a plurality of test leads and a plurality of electric pins, said test leads contact with signal leads of an electric device under test, and said electric pins provide said electric device under test with stimulus test signals from said test signal generator and provide the resulted signals from said electric device under test to said signal comparator;
- setting said electric devices to be tested on seats of a carrier module;
- aligning a plurality of said carrier modules on a test tray for carrying and positioning said carrier modules o a predetermined position corresponding to said test sockets;
- moving either of said test head and said test tray in vertical direction so that said electric devices under test and said test socket contact with each other;

holding said electric devices to be tested in said seats of said carrier module while at rest and releasing said hold from said electric device when contacting between said test socket and said electric device under test, said hold means being provided in said carrier module.

15. A method of electrically contacting leads of an electric device in a contact assembly for testing said electronic device by a test system having a test signal generator and a signal comparator, comprising:

providing a test head for testing a plurality of electric devices in parallel at the same time;

mounting a test socket on said test head and having a plurality of test leads and a plurality of electric pins, said test leads contact with signal leads of an electric device under test, and said electric pins provide said electric device under test with stimulus test signals from said test signal generator and provide the resulted signals from said electric device under test to said signal comparator;

setting said electric devices to be tested on seats of a carrier module;

aligning a plurality of said carrier modules on a test tray for carrying and positioning said carrier modules to a predetermined position corresponding to said test sockets;

moving either of said test head and said test tray in vertical direction so that said electric device under test and said test socket contact with each other;

slidably positioning, in accordance with said vertical movement of said test head and said test tray, said electric devices to be tested whose length is shorter than the length of said seat in said carrier module to a predetermined position corresponding to said test leads of said test socket.

separating said electric device from said test socket after testing by pushing said electric device with said slide bar when returning s id test head and said test tray to non-contact state.

16. A method of electrically contacting leads of an electric device in a contact assembly for testing said electronic device by a test system having a test signal generator and a signal comparator, comprising:

providing a test head for testing a plurality of electric devices in parallel at the same time;

mounting a test socket on said test head and having a plurality of test leads and a plurality of electric pins, said test leads contact with signal leads of an electric device under test, and said electric pins provide said electric device under test with stimulus test signals from said test signal generator and provide the resulted signals from said electric device under test to said signal comparator;

setting said electric devices to be tested on seats of a carrier module;

aligning a plurality of said carrier modules on a test tray for carrying and positioning said carrier modules to a predetermined position corresponding to said test sockets;

moving either of said test head and said test tray in vertical direction so that said electric device under test and said test socket contact with each other;

holding said electric devices to be tested in said seats of said carrier module while at rest and releasing said hold from said electric device when contact between said test socket and said electric device under test in accordance with said vertical movement of said test head and said test tray;

slidably positioning, in accordance with said vertical movement of said test head and said test tray, said electric devices to be tested whose length is shorter than the length of said seat in said carrier module to a predetermined position corresponding to said test leads of said test socket.

separating said electric device from said test socket after testing by pushing said electric device with said slide bar when returning said test head and said test tray to non-contact state.

* * * * *

UNITED STATES PATENT AND TRADEMARK OFFICE
CERTIFICATE OF CORRECTION

PATENT NO. : 5,208,529
DATED : May 4, 1993
INVENTOR(S) : Kazuyuki Tsurishima et al.

It is certified that error appears in the above-indentified patent and that said Letters Patent is hereby corrected as shown below:

```
Column 9, line 65, in Claim 8, replace "cylinder" by --cylinders--.
Column 10, line 64, in Claim 14, replace "o a" by --to a--.
Column 11, line 3, in Claim 14, replace "when contacting" by --when
there is contact--.
Column 11, line 39, in Claim 15, replace "s id" by --said--.
```

Signed and Sealed this

Twenty-seventh Day of February, 1996

Attest:

BRUCE LEHMAN

Attesting Officer

Commissioner of Patents and Trademarks